United States Patent [19]

Takahashi

[11] Patent Number: 5,923,580
[45] Date of Patent: Jul. 13, 1999

[54] SEMICONDUCTOR MEMORY

[75] Inventor: Tetsuji Takahashi, Kanagawa, Japan

[73] Assignee: NEC Corporation, Tokyo, Japan

[21] Appl. No.: 08/921,329

[22] Filed: Aug. 29, 1997

[30] Foreign Application Priority Data

Aug. 29, 1996 [JP] Japan .................................. 8-229092

[51] Int. Cl.⁶ ...................................................... G11C 5/06
[52] U.S. Cl. .................................. 365/51; 365/52; 365/63
[58] Field of Search .................................. 365/51, 52, 63, 365/185, 230.03

[56] References Cited

U.S. PATENT DOCUMENTS 5,369,619  11/1994  Ohba ............................................ 365/63
5,771,200   6/1998  Cho et al. ..................................... 365/51

Primary Examiner—Tan T. Nguyen
Attorney, Agent, or Firm—Whitham, Curtis & Whitham

[57] ABSTRACT

For reducing the area for read/write bus lines to a half and shortening the length of the read/write bus lines so as to speed up the operation, the locating positions of input/output circuits for the corresponding bits, of memory blocks MB1 and MB3a located to oppose to each other and to interpose therebetween an active circuit area ACA and of memory blocks MB2a and MB4 located to oppose to each other and to interpose therebetween the active circuit area ACA, are made different from each other. Read/write bus lines RWB1 to RWB4 of the same length are formed and located to interconnect between the inputs/outputs for the corresponding bits, of the opposing memory blocks, by traversing an empty region between circuit blocks CB in the active circuit area ACA, and in such a manner that each two read/write bus lines extend between the memory blocks MB1 and MB2a and between the memory blocks MB3a and MB4.

4 Claims, 4 Drawing Sheets

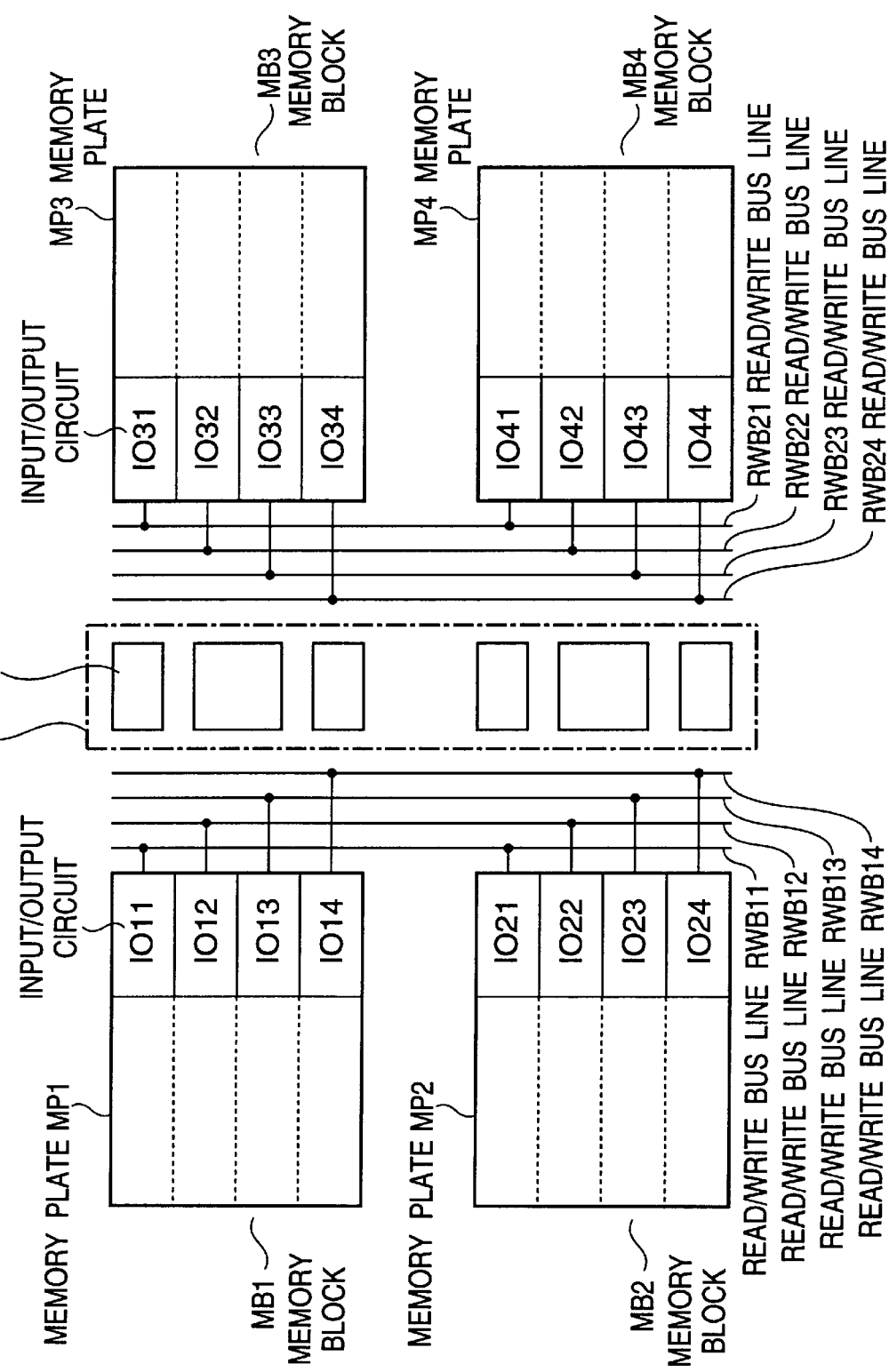

SEMICONDUCTOR MEMORY

BACKGROUND OF THE INVENTION

1. Field of the Invention

The present invention relates to a semiconductor memory, and more specifically to a semiconductor memory including a plurality memory blocks each having a plurality of input/output circuits, and an active circuit area containing different kinds of circuit blocks and located between the input/output circuits of the memory blocks.

2. Description of Related Art

In a semiconductor memory including a plurality memory blocks each having a plurality of input/output circuits in order to receive and output, in parallel, a plurality of bits of writing and reading multi-bit data (simply called "data" or "input/output data" hereinafter) for one or a plurality of memory plates, it is a general practice to locate, between the plurality memory blocks, an active circuit area containing a plurality of circuit blocks for executing a block designation control, an address designation control and a data input/output control for the plurality of memory blocks, in such a manner that the plurality memory blocks are in symmetry to the axis of the active circuit area.

One prior art example of this type semiconductor memory is shown in FIG. 4.

The shown semiconductor memory includes four memory blocks MB1 to MB2 each including four input/output circuits (one set of IO11–IO14, IO21–IO24, IO31–IO34, IO41–IO44) for a parallel inputting/outputting of a 4-bit data for one memory plate (one of MP1 to MP4) (or a plurality of memory plates or which may be divided into a plurality), an active circuit area ACA containing a plurality of circuit blocks CB for executing a block designation control, an address designation control and a data input/output control for the memory blocks MB1 to MB4, and read/write bus lines RWB11 to RWB14 and RWB21 to RWB24 for transferring the input/output data for the memory blocks MB1 to MB4 and also transferring the input/output data through predetermined input/output electrodes (not shown) to an external circuit. The memory blocks are located to locate therebetween the active circuit area ACA in such a manner that the memory blocks MB1 and MB2 are located at one side of the active circuit area ACA and the memory blocks MB3 and MB4 are located at the other side of the active circuit area ACA. Between the memory blocks MB1 and MB2 and the active circuit area ACA, the read/write bus lines RWB11 to RWB14 are located which interconnect between mutually corresponding input/output circuits of the memory blocks MB1 and MB2. Between the memory blocks MB3 and MB4 and the active circuit area ACA, the read/write bus lines RWB21 to RWB24 are located which interconnect between mutually corresponding input/output circuits of the memory blocks MB3 and MB4.

In addition, the input/output data for the mutually corresponding input/output circuits of the memory blocks MB1 to MB4, for example, the input/output data for the input/output circuits IO11, IO21, IO31 and IO41, is transferred from and to an external circuit through the read/write bus lines RWB11 and RWB21 and through one input/output electrode provided for example at a predetermined location in the active circuit area ACA. In other words, assuming that the numbers of No. 1 to No. 4 are allocated to the four bits of the parallel four-bit input/output data, the data inputted and outputted through the mutually corresponding input/output circuits of the memory blocks MB1 to MB4, is the data bit allocated with the same number, of the parallel four-bit input/output data.

In this semiconductor memory, if the numbers of No. 1 to No. 4 are allocated in order from one end to the other end for input/output circuit locating positions of the input/output circuits of the memory blocks MB1 to MB4 for easiness of design and evaluation, the input/output circuits for receiving and outputting the data bit of the same number are located at the input/output circuit locating positions of the same number, of the memory blocks MB1 to MB4 (namely, the input/output circuits IO11, IO21, IO31 and IO41 are located at the first input/output circuit locating position). As mentioned above, furthermore, between the active circuit area ACA and the memory blocks MB1 and MB2, the four read/write bus line RWB11 to RWB14 each for transferring the input/output data bit of the same number are located to extend in parallel to each other and connected to the mutually corresponding input/output circuits of the memory blocks MB1 and MB2, respectively. Between the active circuit area ACA and the memory blocks MB3 and MB4, the four read/write bus line RWB21 to RWB24 each for transferring the input/output data bit of the same number are located to extend in parallel to each other and connected to the mutually corresponding input/output circuits of the memory blocks MB3 and MB4, respectively.

In the above mentioned prior art semiconductor memory, the read/write bus lines RWB11 to RWB14 of the same number as the bit number of the parallel input/output data are located in parallel between the active circuit area ACA and the memory blocks MB1 and MB2 and the read/write bus lines RWB21 to RWB24 of the same number as the bit number of parallel input/output data are located in parallel between the active circuit area ACA and the memory blocks MB3 and MB4. In addition, the mutually corresponding bus lines having the same bit position number, of these read/write bus lines are so configured to transfer data to and from an external circuit through the same input/output electrode. Because of this construction, there was a problem that the total length of the read/write bus lines becomes long, and therefore, the parasite capacitance of the read/write bus lines correspondingly increases, with the result that the operation cannot be speeded up. There also was another problem that the region occupied for the read/write bus lines increases, and therefore, the chip area inevitably becomes large.

In this connection, if the read/write bus lines are located at only one side of the active circuit area and connected to corresponding input/output circuits of the memory blocks positioned at the other side of the active circuit area by traversing the active circuit area, the region for the read/write bus lines can be reduced to a half, and the total length of each read/write bus line can be shortened. However, since the circuit block exists at a position where the interconnection for connecting the mutually corresponding input/output circuits is extended to traverse the active circuit area, it is necessary to detour around the circuit block in question, so that the total length of the read/write bus line correspondingly becomes long. In addition, a wiring area for the detour is required at the side opposite to the side where the read/write bus line is located, with the result that the area for the read/write bus line increases.

SUMMARY OF THE INVENTION

Accordingly, it is an object of the present invention to provide a semiconductor memory which has overcome the above mentioned problems of the prior art.

Another object of the present invention is to provide a semiconductor memory having a read/write bus line area reduced to a half, and a shortened total length of the read/write bus line, thereby to speed up the operation.

A semiconductor memory in accordance with the present invention comprises a first memory block including at least one first memory block and a plurality of first input/output circuits for receiving and outputting, in parallel, a plurality of bits of a multi-bit data, for the at least one first memory block, a second memory block including at least one second memory block and a plurality of second input/output circuits for receiving and outputting, in parallel, the plurality of bits of the multi-bit data, for the at least one second memory block, the plurality of second input/output circuits and the plurality of first input/output circuits being located to oppose to each other, an active circuit area located between the first memory block and the second memory block and including a plurality of circuit blocks for executing various kinds of controls for the first memory block and the second memory block, and a plurality of read/write bus lines located between the active circuit area and the first and second memory blocks and connected to the first and second input/output circuits of the first and second memory blocks for transferring the multi-bit data for the first and second memory blocks, wherein the first and second input/output circuits of the first and second memory blocks are located in such a manner that the locating positions of respective input/output circuits receiving and outputting the corresponding bit of the multi-bit data, of the first and second memory blocks, are different from each other, and the read/write bus lines are located in such a manner that the respective input/output circuits receiving and outputting the corresponding bit of the multi-bit data, of the first and second memory blocks, are interconnected by traversing an empty region between the circuit blocks in the active circuit area and the read/write bus lines have the same length. In addition, the locating positions of the first and second input/output circuits of the first and second memory blocks are exchanged in units of at least two input/output circuits receiving and outputting the mutually corresponding bits of the multi-bit data.

Furthermore, a third memory block including a third memory plate and a plurality of third input/output circuits are located at the side of the first memory block, and a fourth memory block including a fourth memory plate and a plurality of fourth input/output circuits are located at the side of the second memory block, the plurality of third input/output circuits and the plurality of fourth input/output circuits being located oppose to each other while interposing therebetween the active circuit area, and the plurality of read/write bus lines are so located that a half of the plurality of first input/output circuits of the first memory block, which is nearer to the third memory block, than to the second input/output circuits of the corresponding bits of the multi-bit data, of the second memory block, and the input/output circuits of the corresponding bits of the multi-bit data, of the plurality of third input/output circuits of the third memory block, are connected to each other at the side of the first memory block, and a half of the plurality of second input/output circuits of the second memory block, which is nearer to the fourth memory block, than to the first input/output circuits of the corresponding bits of the multi-bit data, of the first memory block, and the fourth input/output circuits of the corresponding bits of the multi-bit data, of the plurality of fourth input/output circuits, are connected to each other at the side of the second memory block, and that the third and fourth input/output circuits of the third and fourth memory blocks are interconnected similarly to the interconnection between the first and second input/output circuits of the first and second memory blocks. In addition, the plurality of read/write bus lines are so located that one half of the half of the plurality of first input/output circuits of the first memory block, are connected to corresponding input/output circuits of the third memory block, and the other half of the half of the plurality of first input/output circuits of the first memory block, are connected to corresponding input/output circuits of the fourth memory block by traversing the empty region between the circuit blocks in the active circuit area, and that one half of the half of the plurality of second input/output circuits of the second memory block, are connected to corresponding input/output circuits of the fourth memory block, and the other half of the half of the plurality of second input/output circuits of the second memory block, are connected to corresponding input/output circuits of the third memory block by traversing the empty region between the circuit blocks in the active circuit area.

BRIEF DESCRIPTION OF THE DRAWINGS

FIG. 4 is a layout diagram illustrating one example of the prior art semiconductor memory.

DESCRIPTION OF THE PREFERRED EMBODIMENTS

Now, embodiments of the semiconductor memory in accordance with the present invention will be described with reference to the accompanying drawings.

Figure 1:
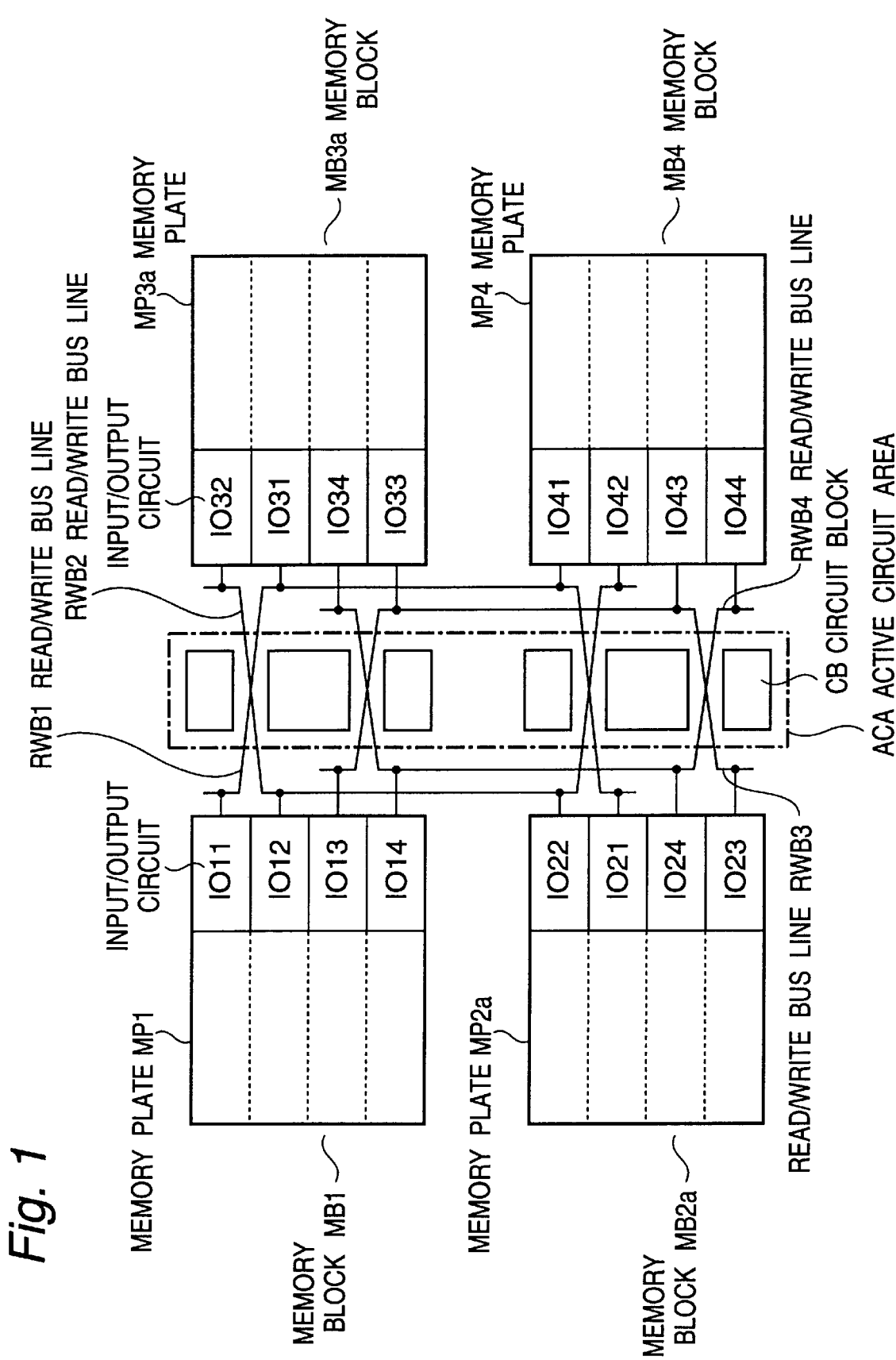
FIG. 1 is a layout diagram illustrating a first embodiment of the semiconductor memory in accordance with the present invention.

FIG. 1 is a layout diagram illustrating a first embodiment of the semiconductor memory in accordance with the present invention.

This first embodiment is different from the prior art semiconductor memory shown in FIG. 4 in the followings: As regards the locating positions of the input/output circuits IO11 to IO14 of the memory block MB1 and the input/output circuits IO31 to IO34 of the memory block MB3 which are located to oppose to each other and to interpose therebetween the active circuit area ACA, the input/output circuits IO31 and IO32 of the memory block MB3 are exchanged by each other, and the input/output circuits IO33 and IO34 are exchanged by each other, so that the locating positions of the input/output circuits receiving and outputting the corresponding bits of the parallel 4-bit input/output data become different between the memory blocks MB1 and MB3. The memory block MB3 modified as mentioned above will be given the Reference Numeral MB3a. The input/output circuits of the memory blocks MB1 and MB3a, for receiving and outputting the corresponding bit of the input/output data, are connected by traversing an empty region between the circuit blocks in the active circuit area ACA.

As regards the locating positions of the input/output circuits of the memory blocks MB2 and MB4, the input/output circuits IO21 and IO22 of the memory block MB2 are exchanged by each other, and the input/output circuits IO23 and IO24 are exchanged by each other, so that the locating positions of the input/output circuits receiving and outputting the corresponding bit of the parallel 4-bit input/output data become different between the memory blocks MB2 and MB4. The memory block MB2 modified as mentioned above will be given the Reference Numeral MB2a. The input/output circuits of the memory blocks MB2a and MB4, for receiving and outputting the corresponding bit of the input/output data, are connected by traversing an empty region between the circuit blocks in the active circuit area ACA.

Furthermore, a half IO12 and IO14 of the input/output circuits IO11 to IO14 of the memory block MB1 which are located nearer to the memory block MB2a than to the input/output circuits for the corresponding bits in the memory block MB3a, and the input/output circuits IO22 and IO24 of the corresponding bits, of the input/output circuits IO21 to IO24 of the memory block MB2a, are mutually connected at the side of the active circuit area near to the memory block MB1. A half IO31 and IO33 of the input/output circuits IO31 to IO34 of the memory block MB3a which are located nearer to the memory block MB4 than to the input/output circuits for the corresponding bits in the memory block MB1, and the input/output circuits IO41 and IO42 of the memory block MB4, are mutually connected at the side of the active circuit area near to the memory block MB3a. In addition, the read/write bus lines RWB 11 to RWB14 and RWB21 to RWB24 are replaced by read/write bus line RWB1 to RWB4 which are configured to fulfill the above mentioned conditions and to have the total length of the same length.

In this first embodiment, since the input/output circuits for the corresponding bit, of the four memory block MB1, MB2a, MB3a and MB4 (for example, IO11, IO21, IO31 and IO41) can be connected by one read/write bus line (RWB1) in order in such a direction that the numbers of the input/output circuit locating positions are ceaselessly in a forward direction (namely, without going backward), the respective lengths of the read/write bus lines RWB1 to RWB4 can be shortened, and therefore, the parasite capacitance of the read/write bus lines can be correspondingly reduced, so that a high speed operation can be achieved. In addition, since only two read/write bus lines extend at each side of the active circuit area ACA, the area for the read/write bus lines can be reduced to a half the area required in the prior art, and therefore, the chip area can be correspondingly reduced. Furthermore, since the read/write bus lines traversing the active circuit area ACA are easily located in the empty region between the circuit blocks, the area of the active circuit area ACA does not increase at all.

Figure 2:
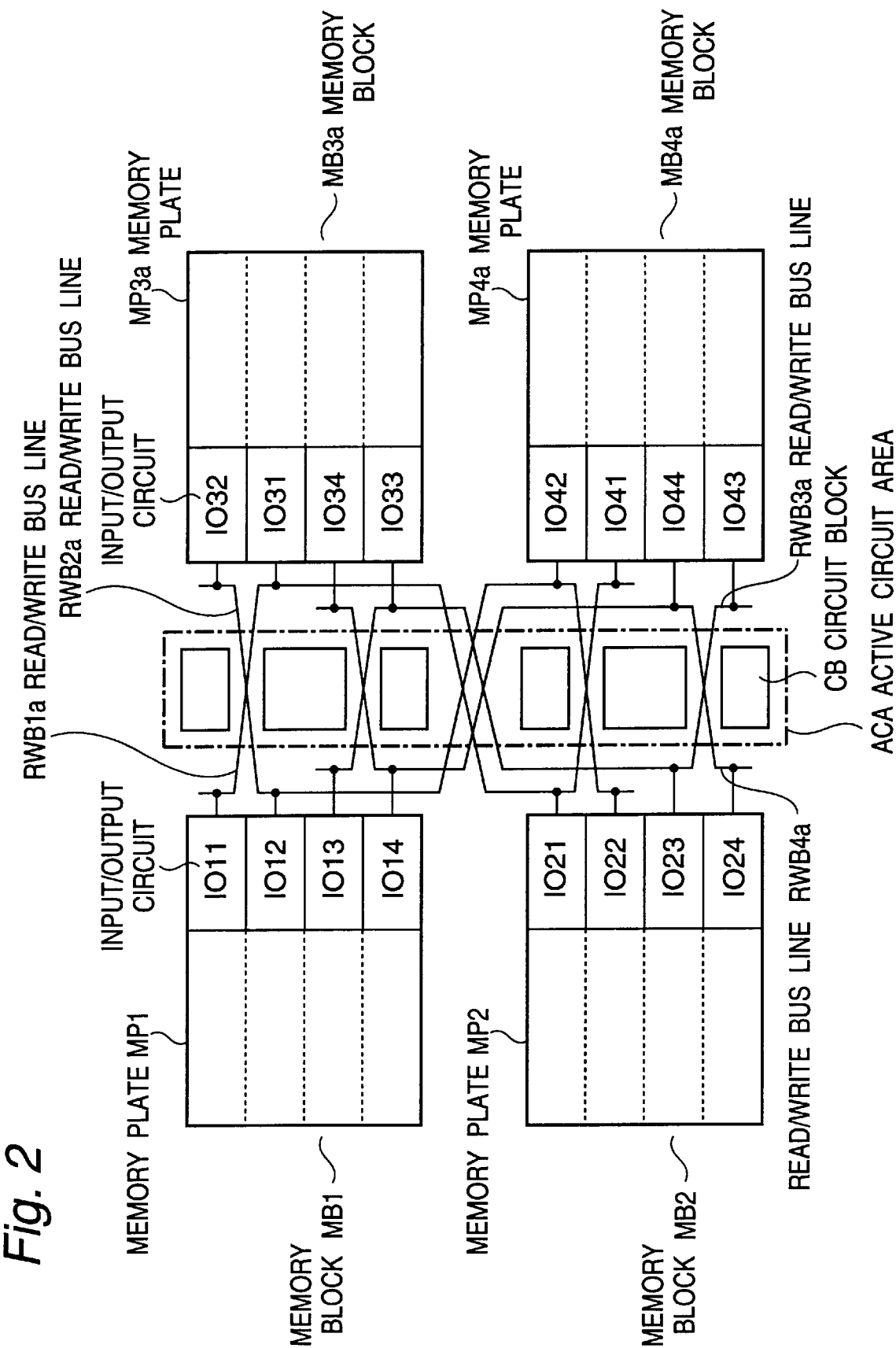
FIG. 2 is a layout diagram illustrating a second embodiment of the semiconductor memory in accordance with the present invention.

FIG. 2 is a layout diagram illustrating a second embodiment of the semiconductor memory in accordance with the present invention.

The second embodiment is different from the first embodiment shown in FIG. 1 in the followings: The memory block at a left lower side of the active circuit area ACA was different from the prior art in the first embodiment, but is the same as the prior art in this second embodiment. On the other hand, the memory block at a right lower side of the active circuit area ACA was the same as the prior art in the first embodiment, but is different from the prior art in this second embodiment. Because of these difference, the connection path of the read/write bus lines is different from that of the first embodiment.

In this second embodiment, the number of the traverses of each one read/write bus line traversing the active circuit area is increased by one, in comparison with the first embodiment, and the total length of each read/write bus line correspondingly becomes long. However, comparing with the prior art, an advantage similar to that of the first embodiment can be obtained in the second embodiment.

Figure 3:
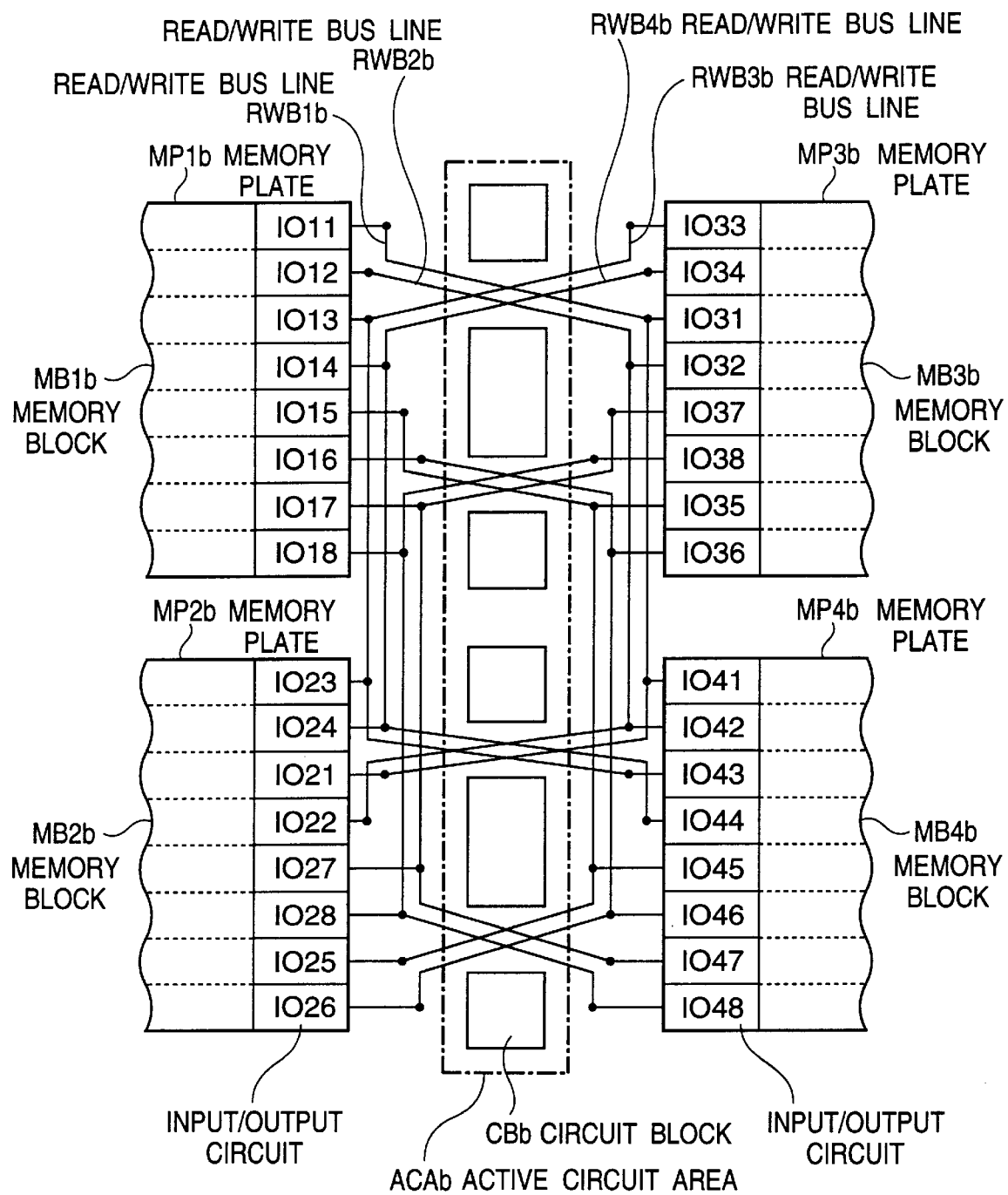
FIG. 3 is a layout diagram illustrating a third embodiment of the semiconductor memory in accordance with the present invention.

FIG. 3 is a layout diagram illustrating a third embodiment of the semiconductor memory in accordance with the present invention.

In this third embodiment, the present invention is applied to a semiconductor memory in which each memory block has eight input/output circuits, namely, the bit number of the parallel input/output data is eight.

In this third embodiment, the locating positions of the input/output circuits are exchanged in units of two input/output circuits. Assuming that each two input/output circuits constitute one unit of input/output circuits, the path of forming and locating the read/write bus line is the same as that in the first embodiment. Of course, the read/write bus lines for the two input/output circuits constituting one unit of input/output circuits are formed and located separately from each other.

In this third embodiment, it would be apparent that an advantage similar to that of the first embodiment can be obtained.

In the first to third embodiments as mentioned above, each two memory blocks are located at each side of the active circuit area ACA. However, it would be apparent that only one memory block can be located at each side of the active circuit area ACA, and three or more memory blocks can be located at each side of the active circuit area ACA. In the case that only one memory block is located at each side of the active circuit area ACA, it is sufficient if only the upper side memory blocks are left in FIGS. 1 to 3 and the lower side memory blocks and the associated read/write bus lines are removed. On the other hand, in the case that three or more memory blocks are located at each side of the active circuit area ACA, it is sufficient if the read/write bus lines connecting between the memory blocks located at opposite sides of the active circuit area, respectively, to interpose therebetween the active circuit area, are formed and located similarly to the first to third embodiments, and if the read/write bus lines connecting between the memory blocks located in a vertical direction are formed and located similarly to the first to third embodiments.

As mentioned above, the semiconductor memory in accordance with the present invention is characterized in that the locating positions of the input/output circuits of the corresponding bit, in the memory blocks located at opposite sides of the active circuit area, respectively, to interpose therebetween the active circuit area, are made different from each other, and the input/output circuits of the corresponding bit, in the memory blocks located at the opposite sides of the active circuit area, are interconnected by traversing the empty region between the circuit blocks in the active circuit area. When a plurality of memory blocks are located at each side of the active circuit area, each two sets, each set composed of two memory blocks located at opposite sides of the active circuit area, respectively, are connected by a plurality of read/write bus lines having the same length, a half of the plurality of read/write bus lines being located at each side of the active circuit area, and being equal to a half the bit number of the parallel input/output data (namely, the number of the input/output circuits associated to each one memory block). With this arrangement, the total length of the read/write bus line can be shortened, so that the operation can be speeded up, and furthermore, the area for the read/write bus lines can be reduced to a half, so that the chip area can be correspondingly reduced.

I claim:

1. A semiconductor memory comprising a first memory block including at least one first memory block and a plurality of first input/output circuits for receiving and outputting, in parallel, a plurality of bits of a multi-bit data, for said at least one first memory block, a second memory block including at least one second memory block and a plurality of second input/output circuits for receiving and outputting, in parallel, said plurality of bits of said multi-bit data, for said at least one second memory block, said plurality of second input/output circuits and said plurality of first input/output circuits being located to oppose to each other, an active circuit area located between said first memory block and said second memory block and including a plurality of circuit blocks for executing various kinds of controls for said first memory block and said second memory block, and a plurality of read/write bus lines located between said active circuit area and said first and second memory blocks and connected to said first and second input/output circuits of said first and second memory blocks for transferring said multi-bit data for said first and second memory blocks, wherein said first and second input/output circuits of said first and second memory blocks are located in such a manner that the locating positions of respective input/output circuits receiving and outputting the corresponding bit of said multi-bit data, of said first and second memory blocks, are different from each other, and said read/write bus lines are located in such a manner that said respective input/output circuits receiving and outputting the corresponding bit of said multi-bit data, of said first and second memory blocks, are interconnected by traversing an empty region between said circuit blocks in said active circuit area and said read/write bus lines have the same length.

2. A semiconductor memory claimed in claim 1 wherein the locating positions of said first and second input/output circuits of said first and second memory blocks are exchanged in units of at least two input/output circuits receiving and outputting the mutually corresponding bits of said multi-bit data.

3. A semiconductor memory claimed in claim 1 wherein a third memory block including a third memory plate and a plurality of third input/output circuits are located at the side of said first memory block, and a fourth memory block including a fourth memory plate and a plurality of fourth input/output circuits are located at the side of said second memory block, said plurality of third input/output circuits and said plurality of fourth input/output circuits being located oppose to each other while interposing therebetween said active circuit area, and wherein said plurality of read/write bus lines are so located that a half of said plurality of first input/output circuits of said first memory block, which is nearer to said third memory block, than to the second input/output circuits of the corresponding bits of said multi-bit data, of said second memory block, and the input/output circuits of said corresponding bits of said multi-bit data, of said plurality of third input/output circuits of said third memory block, are connected to each other at the side of said first memory block, and a half of said plurality of second input/output circuits of said second memory block, which is nearer to said fourth memory block, than to the first input/output circuits of the corresponding bits of said multi-bit data, of said first memory block, and the fourth input/output circuits of the corresponding bits of said multi-bit data, of said plurality of fourth input/output circuits, are connected to each other at the side of said second memory block, and that said third and fourth input/output circuits of said third and fourth memory blocks are interconnected similarly to the interconnection between said first and second input/output circuits of said first and second memory blocks.

4. A semiconductor memory claimed in claim 3 wherein said plurality of read/write bus lines are so located that one half of said half of said plurality of first input/output circuits of said first memory block, are connected to corresponding input/output circuits of said third memory block, and the other half of said half of said plurality of first input/output circuits of said first memory block, are connected to corresponding input/output circuits of said fourth memory block by traversing the empty region between the circuit blocks in said active circuit area, and that one half of said half of said plurality of second input/output circuits of said second memory block, are connected to corresponding input/output circuits of said fourth memory block, and the other half of said half of said plurality of second input/output circuits of said second memory block, are connected to corresponding input/output circuits of said third memory block by traversing the empty region between the circuit blocks in said active circuit area.

* * * * *